(12) United States Patent
Sunohara (10) Patent No.: US 7,214,565 B2
(45) Date of Patent: May 8, 2007

(54) MANUFACTURING METHOD OF AN ELECTRONIC PART BUILT-IN SUBSTRATE

(75) Inventor: Masahiro Sunohara, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 11/203,700

(22) Filed: Aug. 15, 2005

(65) Prior Publication Data

US 2006/0040463 A1    Feb. 23, 2006

(30) Foreign Application Priority Data

Aug. 19, 2004    (JP) ............................. 2004-239782

(51) Int. Cl.
*H01L 21/44* (2006.01)
(52) U.S. Cl. ............... 438/108; 438/107; 438/109; 438/110; 438/E23.006
(58) Field of Classification Search ............... 438/106, 438/618; 257/774, 778
See application file for complete search history.

(56) References Cited

U.S. PATENT DOCUMENTS 6,914,322 B2 *   7/2005  Iijima et al. ................. 257/678
2003/0111734 A1 *   6/2003  Kobayashi et al. .......... 257/774

FOREIGN PATENT DOCUMENTS

JP    2003 197809    7/2003

* cited by examiner

*Primary Examiner*—Dung A. Le
(74) *Attorney, Agent, or Firm*—Ladas & Parry LLP (57) ABSTRACT

A manufacturing method of an electronic part built-in substrate is disclosed, wherein an electronic part is contained in a build-up layer, the manufacturing method including a step for arranging an electronic part on a conductive supporting object such that the electronic part is electrically connected to the conductive supporting object, a step for forming build-up layers on the supporting object such that the electronic part is contained in the build-up layers, and a step for forming a wiring layer electrically connected to the electronic part by shaping the supporting object.

5 Claims, 7 Drawing Sheets

MANUFACTURING METHOD OF AN ELECTRONIC PART BUILT-IN SUBSTRATE

BACKGROUND OF THE INVENTION

1. Field of the Invention

The present invention generally relates to a manufacturing method of an electronic part built-in substrate, and specifically relates to a manufacturing method of an electronic part built-in substrate that includes an electronic part, and a build-up layer wherein wiring for connecting the electronic part is formed.

2. Description of the Related Art

In recent years and continuing, the operating frequency of a semiconductor apparatus has been continually increasing; accordingly, it has become increasingly important to ensure that electric supplies are sufficiently stabilized. One method of ensuring stabilization of electric supplies is to use a substrate that contains an electronic part (for example, a capacitor), (henceforth referred to as "an electronic part built-in substrate").

Conventionally, two or more build-up layers are formed on a supporting object, and an electronic part is installed inside of one of the build-up layers as indicated by Patent Reference 1 (a build-up layer in which an electronic part is installed is called a device built-in build-up layer).

Specifically, a supporting object is prepared, and the build-up layers and wiring layers are formed in layers on the supporting object using a build-up method. When laminating a device built-in build-up layer to one of the build-up layers, a cavity forms in the device built-in build-up layer, and an electronic part is arranged in the cavity. Then, a build-up layer and a wiring layer are further formed on the device built-in build-up layer. At this time, vias that connect the layers are also formed.

When the build-up layer that contains the electronic parts is formed on the supporting object, a part of the supporting object is removed. The wiring layer is exposed where the supporting object has been removed. This is the technique used for manufacturing the electronic part built-in substrate.

After mounting a semiconductor device to the electronic part built-in substrate manufactured as described above, the semiconductor device is attached to the site where the supporting object is removed. Thus, an electrode of the semiconductor device is connected to wiring exposed at the part where the supporting object is removed, and the semiconductor device and the electronic part built-in substrate are electrically connected.

At that site, the supporting object reinforces of the build-up layer. Accordingly, the supporting object is entirely removed after the build-up layer is sufficiently strong.

[Patent reference 1] JPA 2003-197809

DESCRIPTION OF THE INVENTION

Problem(s) to be Solved by the Invention

As described above, according to the conventional manufacturing method of the electronic part built-in substrate, the supporting object only reinforces the build-up layer(s). For this reason, a process of removing the supporting object is necessary, which is a problem in view of the manufacturing efficiency.

SUMMARY OF THE INVENTION

In response to the limitations and disadvantages of the prior art, the present invention is aimed at offering a manufacturing method of the electronic part built-in substrate, wherein the supporting object serves not only as reinforcement, but also as wiring.

The features and advantages of the present invention are set forth in the description that follows, and will be illustrated further in the description and corresponding drawings; furthermore, examples of embodiments will also be provided in the description. The specification demonstrates the structure and manufacturing method of the electronic part built-in substrate in full, clear, concise, and exact terms as to enable a person having ordinary skill in the art to practice the invention.

The manufacturing method of the electronic part built-in substrate is as follows.

Means for Solving the Problem

In order to solve the above-described problem, the present invention is characterized by providing solutions described as follows.

The manufacturing method of the electronic part built-in substrate according to the first aspect of the present invention includes:

a step of arranging an electronic part to a supporting object that is made of a conductive material such that the electronic part is electrically connected to the supporting object;

a step of forming a build-up layer on the supporting object to which the electronic part is arranged such that the electronic part is built-in; and a wiring formation step of forming wiring that is connected to the electronic part by appropriately shaping the supporting object.

The manufacturing method of the electronic part built-in substrate according to the second aspect of the present invention includes:

a first build-up layer forming process of forming a first build-up layer on the supporting object that consists of a conductive material by laminating layers to a thickness equal to the thickness of the electronic part;

a cavity formation process of forming a cavity for accommodating the electronic part in the build-up layer;

an accommodation process of accommodating the electronic part to the cavity;

a second build-up layer forming process of forming a build-up layer on the first build-up layer to which the cavity is formed, and on the electronic part; and a wiring formation step of forming wiring that is connected to the electronic part by appropriately shaping the supporting object.

As described above, according to the present invention, the supporting object is composed of a conductive material allowing the supporting object to support the build-up layer. After the build-up layer is formed, it may serve as wiring if properly shaped. Thus, the manufacturing process is simplified, and the number of components is reduced.

Furthermore, according to another aspect of the present invention, the wiring formation step of the manufacturing method of the electronic part built-in substrate utilizes an etching method in order to fashion the supporting object into a desired shape.

Thus, the supporting object may be easily formed.

Furthermore, during the first and the second build-up layer forming processes, a semi-additive method may be used.

Accordingly, the wiring layer fits more precisely to each of the build-up layers, and electronic parts may be densely packed into the substrate.

Effect of the Invention

The present invention greatly improves the manufacture and effectiveness of the supporting object: the supporting object supports the build-up layers and also serves as wiring; furthermore, this technique simplifies the manufacturing process and decreases the number of components.

DESCRIPTION OF THE PREFERRED EMBODIMENTS

In the following, embodiments of the present invention are described with reference to the accompanying drawings.

Figure 8:
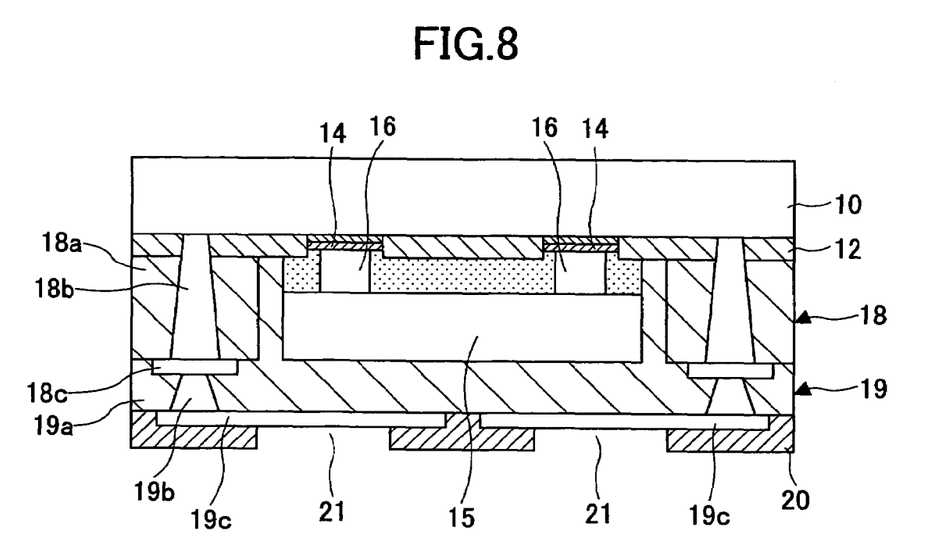
FIG. 8 is a cross-sectional view explaining the manufacturing method of the electronic part built-in substrate according to the first embodiment of the present invention (part 8)
Figure 9:
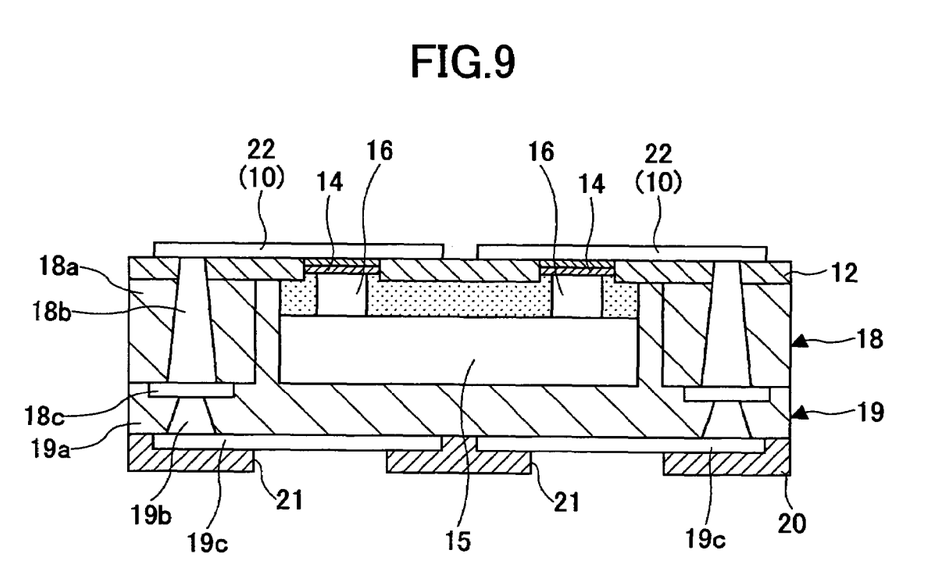
FIG. 9 is a cross-sectional view explaining the manufacturing method of the electronic part built-in substrate according to the first embodiment of the present invention (part 9)
Figure 10:
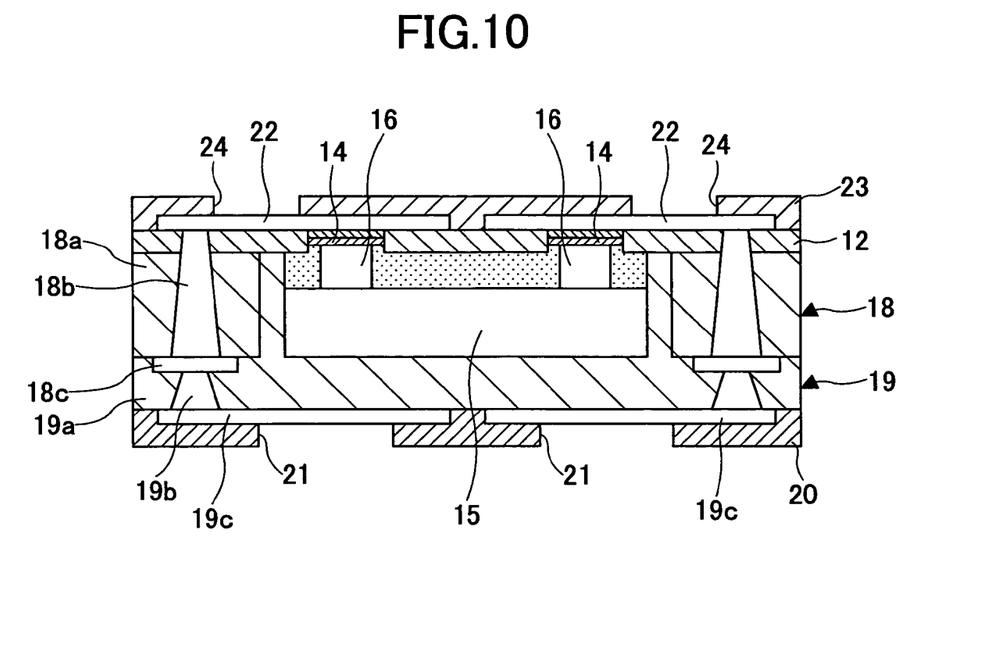
FIG. 10 is a cross-sectional view explaining the manufacturing method of the electronic part built-in substrate according to the first embodiment of the present invention (part 10)
Figure 11:
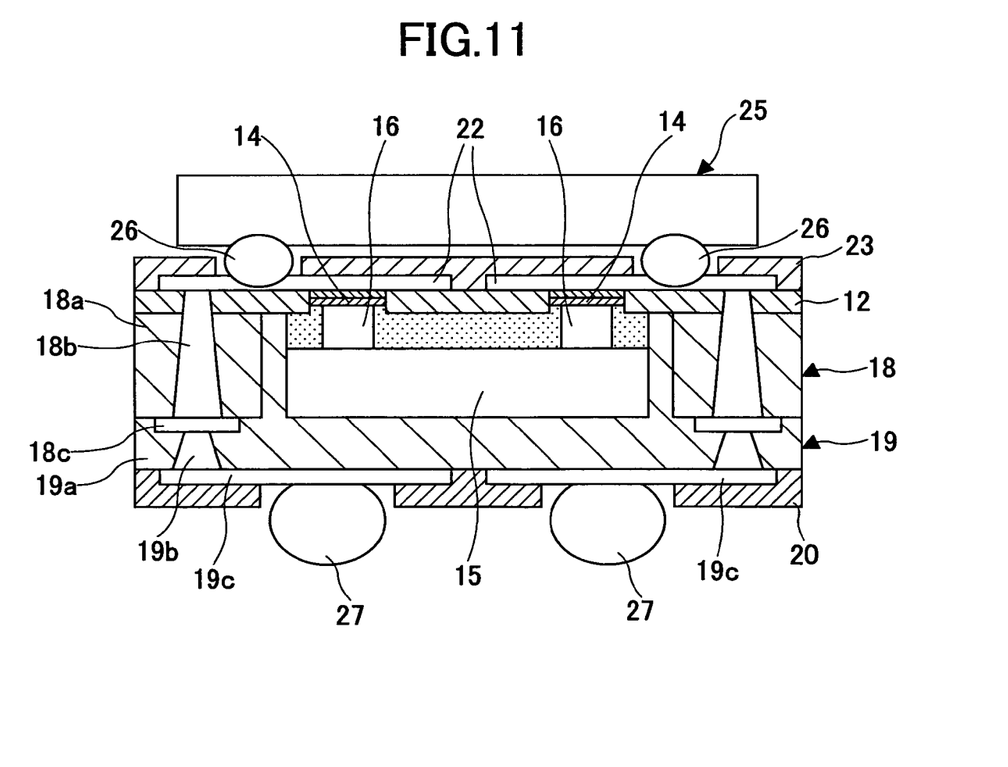
FIG. 11 is a cross-sectional view showing a semiconductor apparatus using the electronic part built-in substrate manufactured by the manufacturing method according to the first embodiment.

FIGS. 1 through 11 show the manufacturing method of the electronic part built-in substrate according to the first embodiment of the present invention, presented in the sequence of the manufacturing process. Specifically, FIG. 10 shows the electronic part built-in substrate manufactured according to the manufacturing method of the first embodiment, and FIG. 11 shows a semiconductor apparatus manufactured using the electronic part built-in substrate. First, according to the present embodiment of the invention (shown in FIG. 10 and FIG. 11), the structure of the electronic part built-in substrate and the semiconductor apparatus manufactured by the manufacturing method is as follows.

In FIG. 10, the electronic part built-in substrate includes a built-in electronic part 15, build-up layers 18 and 19, and solder resists 12, 20, and 23. The build-up layer 18 and the build-up layer 19 are laminated, and the lamination contains the built-in electronic part 15 inside. The build-up layer 18 includes an insulation layer 18a, a via 18b, and a wiring layer 18c. The build-up layer 19 includes an insulation layer 19a, a via 19b, and a wiring layer 19c.

The solder resist 12 is arranged on the upper surface of the build-up layers 18 and 19 that are laminated, and the upper wiring 22 is formed on the upper surface of the solder resist 12. Further, openings 13 (refer to FIG. 2) are formed to the solder resist 12 at positions that correspond to vamps 16 that are formed to the built-in electronic part 15.

Barrier metal layers 14 are formed to the upper wiring 22 at positions that counter the respective openings 13. The vamps 16 formed to the built-in electronic part 15 are bonded to the respective barrier metal layers 14, and electrically connected to the upper wiring 22. Further, the solder resist 23 is formed in the upper part of the upper wiring 22. Openings 24 are formed at predetermined positions of the solder resist 23, exposing the upper wiring 22 at the openings 24.

Further, a wiring layer 19c is formed on the undersurface of the build-up layers 18 and 19 that are laminated. The wiring layer 19c is covered by the solder resist 20 that has openings 21 at predetermined positions exposing the wiring layer 19c at the predetermined positions.

Further, the vias 18b and 19b vertically penetrate the laminated build-up layers 18 and 19. The upper end of the vias 18b and 19b (combined) is connected to the upper wiring 22, and the lower end is connected to the wiring layer 19c. Accordingly, the wiring layer 19c and the upper wiring 22 are electrically connected by the vias 18b and 19b.

The semiconductor apparatus shown in FIG. 11 includes the electronic part built-in substrate shown in FIG. 10, a semiconductor device 25 mounted to the electronic part built-in substrate, and solder balls 27. The semiconductor device 25 is mounted on the electronic part built-in substrate by solder vamps 26 being flip-chip bonded to the upper wiring 22. The solder balls 27 are bonded to the wiring layer 19c that is exposed at the openings 21 of the solder resist 20.

As shown in FIG. 10 and FIG. 11, the electronic part built-in substrate according to the embodiment does not include a substrate, namely a core substrate. For this reason, the electronic part built-in substrate is thinner. Furthermore, although a chip capacitor serves as the built-in electronic part 15 in the embodiment, the built-in electronic part 15 is not limited to a chip capacitor.

Next, the manufacturing method of the electronic part built-in substrate according to the first embodiment of the present invention is described.

Figure 1:
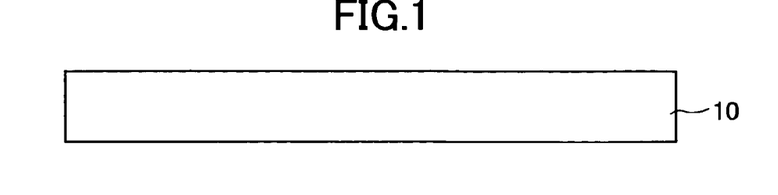
FIG. 1 is a cross-sectional view explaining a manufacturing method of an electronic part built-in substrate according to the first embodiment of the present invention (part 1)

First, a supporting object 10 (as shown in FIG. 1) is prepared. The supporting object 10 is made of a conductive metal material, and a copper plate providing excellent conductivity is used in the present embodiment.

Figure 2:
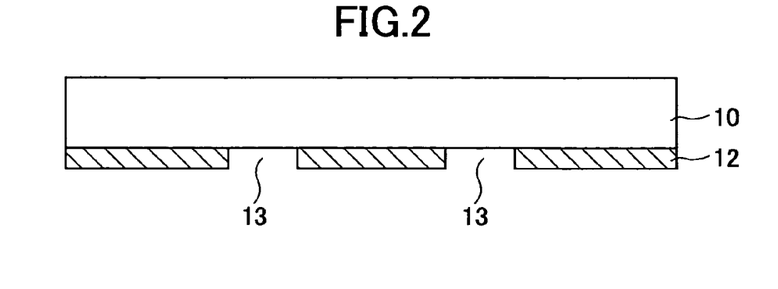
FIG. 2 is a cross-sectional view explaining the manufacturing method of the electronic part built-in substrate according to the first embodiment of the present invention (part 2)
Figure 3:
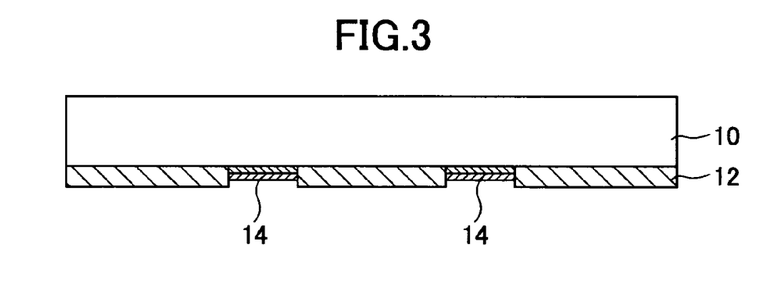
FIG. 3 is a cross-sectional view explaining the manufacturing method of the electronic part built-in substrate according to the first embodiment of the present invention (part 3)

The solder resist 12 is applied to the undersurface of the supporting object 10, and openings 13 are formed at the positions that correspond to the vamps 16 of the built-in electronic part 15 (as shown in FIG. 2). The barrier metal layers 14 are formed on the supporting object 10 at the positions exposed by the openings 13 (shown in FIG. 3). The barrier metal layers 14 are structured by laminating a nickel layer and a gold layer formed by plating.

Figure 4:
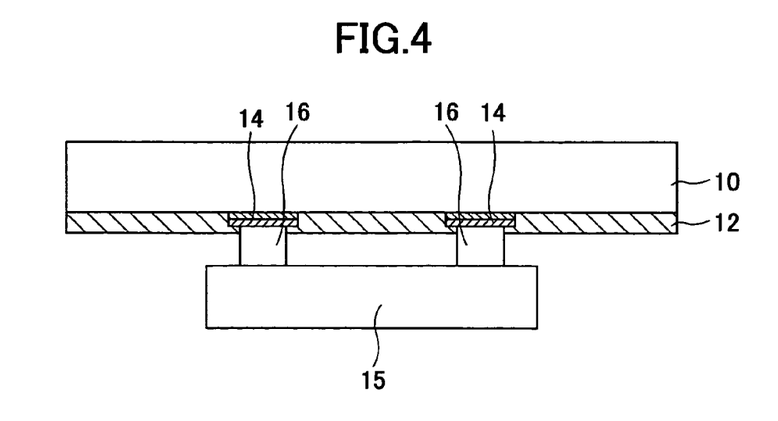
FIG. 4 is a cross-sectional view explaining the manufacturing method of the electronic part built-in substrate according to the first embodiment of the present invention (part 4)
Figure 5:
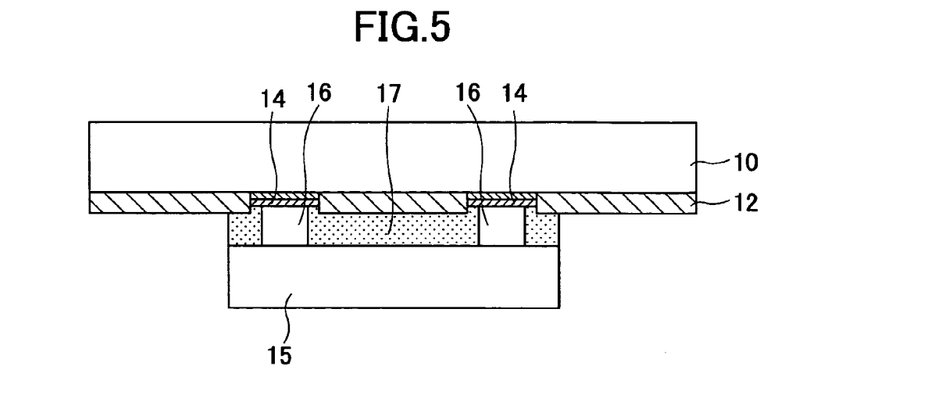
FIG. 5 is a cross-sectional view explaining the manufacturing method of the electronic part built-in substrate according to the first embodiment of the present invention (part 5)

When the barrier metal layers 14 are formed as described above, the built-in electronic part 15 is mounted to the supporting object 10 as shown in FIG. 4. The built-in electronic part 15 has the vamps 16, the vamps 16 are ultrasonic-welded to the respective barrier metal layers 14, and the built-in electronic part 15 is flip-chip bonded to the supporting object 10. Then, an underfill resin 17 is poured between the supporting object 10 and the built-in electronic part 15 (as shown in FIG. 5).

Pursuant to mounting the built-in electronic part 15 to the supporting object 10 as described above, a process of forming the build-up layer 18 (including the insulation layer 18a, the via 18b, and the wiring layer 18c) and the build-up layer 19 (including the insulation layer 19a, the via 19b, and the wiring layer 19c) starts. Formation of the build-up layers 18 and 19 is performed using a build-up method. Although various build-up methods are available, this embodiment utilizes a semi-additive method for the build-up method.

In order to form the build-up layer 18, the insulation layer 18a is first mounted on the supporting object 10. The insulation layer 18a serves as an insulated resin film for build-up (henceforth "a build-up film"), and has a cavity 30 that is beforehand formed at the mounting position of the built-in electronic part 15. The insulation layer 18a is arranged to the supporting object 10, e.g., by carrying out a vacuum lamination. At this point, the thickness of the insulation layer 18a is made approximately equal to the height of the built-in electronic part 15 measured from the supporting object 10.

Pursuant to the formation of the insulation layer 18a, the via 18b and the wiring layer 18c are formed to the insulation layer 18a using a publicly known method. Specifically, a via hole is formed by a laser at the formation position of the via 18b of the insulation layer 18a. At this time, a hole that passes through the solder resist 12 reaching the supporting object 10 is formed.

Figure 6:
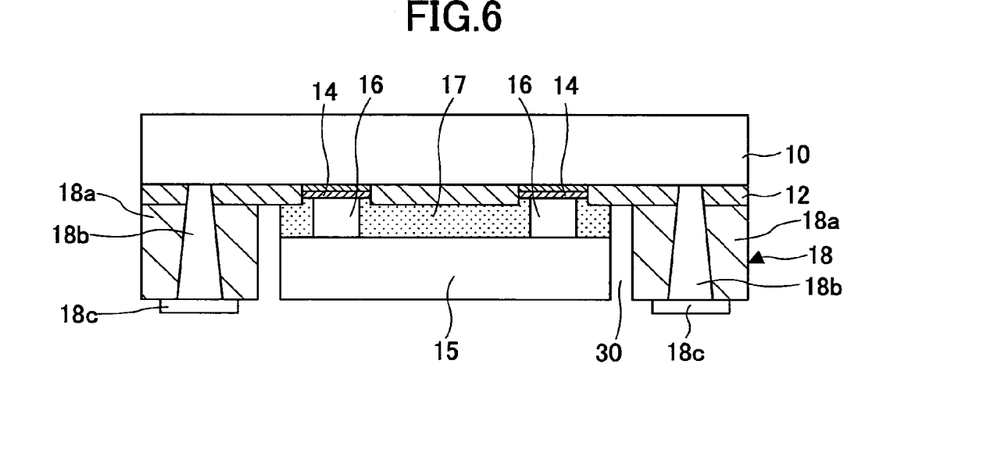
FIG. 6 is a cross-sectional view explaining the manufacturing method of the electronic part built-in substrate according to the first embodiment of the present invention (part 6)

Then, a seed layer is formed on the surface of the insulation layer 18a, in which the via hole is formed, except for the place where the cavity 30 is formed, by an electroless plating method. Then, electrolysis copper plating is carried out with the seed layer serving as an electrode for electric supply, and a copper layer is formed on the surface of the insulation layer 18a. Then, patterning of the copper layer is carried out, and, thereby, the via 18b and the wiring layer 18c are formed. FIG. 6 shows the state where the build-up layer 18 is formed to the supporting object 10.

Figure 7:
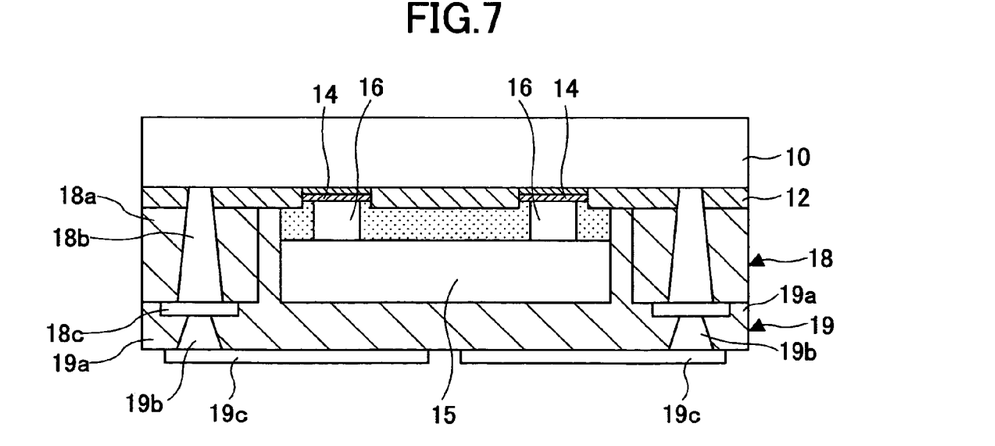
FIG. 7 is a cross-sectional view explaining the manufacturing method of the electronic part built-in substrate according to the first embodiment of the present invention (part 7)

Pursuant to the formation of the build-up layer 18, the build-up layer 19 is laminated so that the build-up layer 18 is covered. The formation method of the build-up layer 19 is almost the same as the formation method of the build-up layer 18 described above, and the explanation is not repeated. With the build-up layer 19 being built, the built-in electronic part 15 is contained in the build-up layers 18 and 19 that are laminated as shown in FIG. 7.

The laminated build-up layers 18 and 19 (insulation layer 18a and insulation layer 19a) are hardened through curing (heat-treatment). After curing is complete, the laminated build-up layers 18 and 19 have a predetermined mechanical strength.

Then, openings 21 are formed at the position in which the solder balls 27 (described above) are to be arranged, while a solder resist 20 is formed on the undersurface of the build-up layer 19 to which the wiring layer 19c is formed. FIG. 8 shows the state where the solder resist 20 has been formed.

Then, the supporting object 10 is subjected to a shaping process. The shaping process (hereinafter called a thin film process) entails modifying the thickness of the supporting object 10 to a predetermined thickness (for example, about 20 μm). The thin film process may be performed using any of the following methods: etching, mechanical cutting, and a grinding process. Although thinning the supporting object 10 in this way reduces reinforcement power for the build-up layers 18 and 19, the curing process described above increases the mechanical strength of the build-up layers 18 and 19. Accordingly, the strength of the electronic part built-in substrate does not decrease, even though the supporting object 10 is thinner.

After the thin film process where the thickness of the supporting object 10 is modified to a predetermined thickness, the thinned supporting object 10 is then subjected to a patterning process, and the upper wiring 22 is formed as shown in FIG. 9. As described with reference to FIG. 4, the built-in electronic part 15 is flip-chip bonded to the supporting object 10 (upper wiring 22). Accordingly, no additional process for connecting the built-in electronic part 15 to the upper wiring 22 is needed. Furthermore, additional wiring in the upper part of the build-up layer 18 is unnecessary.

Then, openings 24 are formed at the positions where the solder vamps 26 of the semiconductor device 25 are bonded while the solder resist 23 is arranged in the upper part of the upper wiring 22. Thus, the electronic part built-in substrate shown in FIG. 10 is manufactured.

As described above, according to the embodiment, the supporting object 10 is made of a conductive material, supports and reinforces the build-up layers 18 and 19, and serves as the upper wiring 22 through the thin film process and the patterning process. In this way, the supporting object 10 serves two functions: it supports the build-up layers 18 and 19 and serves as the upper wiring 22. Accordingly, the manufacturing process of the electronic part built-in substrate is greatly simplified, and the number of components is decreased.

Next, the manufacturing method of the electronic part built-in substrate according to the second embodiment of the present invention is described.

FIG. 12 through FIG. 17 show the manufacturing method of the electronic part built-in substrate according to the second embodiment. In FIGS. 1 through 11, the structures are identified with the same reference numbers; therefore, the description of the structure would be redundant. Furthermore, the manufacturing process shown in FIGS. 1 through 5 in the first embodiment is used in the second embodiment; and accordingly, only a process that is different is illustrated and described.

In the first embodiment, the thickness of the insulation layer 18a that constitutes the build-up layer 18 is made to approximately the height of the built-in electronic part 15 measured from the supporting object 10 as shown in FIG. 6. In contrast, in the second embodiment, the height of the lamination of the build-up layers 18 and 19 is set to approximately the height of the built-in electronic part 15 measured from the supporting object 10.

Specifically, the build-up layer 18 (including the insulation layer 18a, the via 18b, and the wiring layer 18c) is first formed to the supporting object 10 to which the built-in electronic part 15 is mounted shown in FIG. 5. Then, laminating formation of the build-up layer 19 (including the insulation layer 19a, the via 19b, and the wiring layer 19c) is carried out to the build-up layer 18. Here, the formation method of the build-up layers 18 and 19 is the same as the first embodiment, and the explanation is not repeated (further, the same formation method applies to a build-up layer 28 described later).

The cavity 30 for containing the built-in electronic part 15 is beforehand formed in the insulation layers 18a and 19a. Therefore, the built-in electronic part 15 is accommodated in the cavity 30. By setting thickness as described above, the back (i.e., the undersurface in the drawing) of the built-in electronic part 15 is approximately at the surface level of the build-up layer 19. Hereafter, the laminated build-up layers 18 and 19 are referred to as a build-up laminating object 29.

Figure 13:
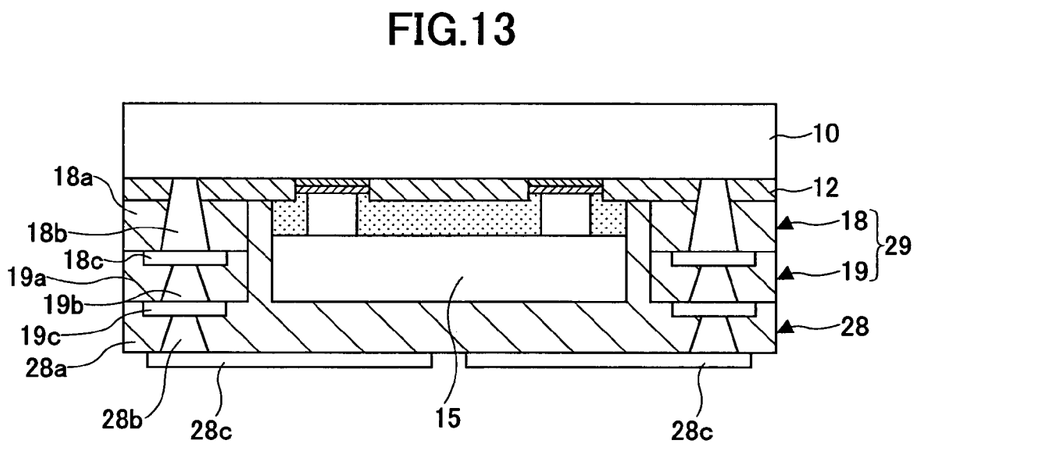
FIG. 13 is a cross-sectional view explaining the manufacturing method of the electronic part built-in substrate according to the second embodiment of the present invention (part 2)

Pursuant to the formation of the build-up laminating object 29 as described above, a formation process of the build-up layer 28 is performed. FIG. 13 shows the state where the build-up layer 28 has been formed, wherein a via 28b and a wiring layer 28c are formed.

Pursuant to the laminating formation of the build-up layer 28 to the build-up laminating object 29, each of the build-up layers 18, 19, and 28 (the insulation layer 18a, the insulation layer 19a, and the insulation layer 28a) that are laminated is hardened by carrying out a cure (heat-treatment). After the curing process is complete, the laminated build-up layers 18, 19, and 28 provide predetermined mechanical strength.

Figure 14:
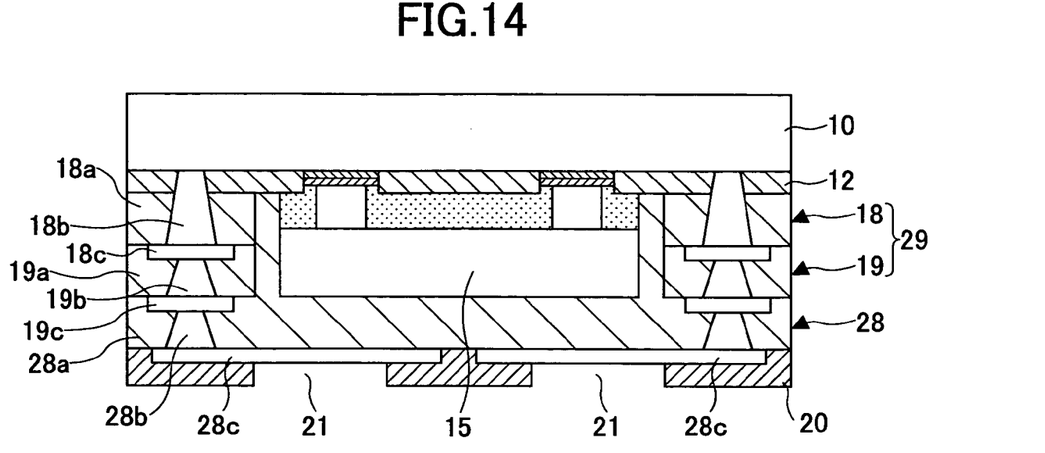
FIG. 14 is a cross-sectional view explaining the manufacturing method of the electronic part built-in substrate according to the second embodiment of the present invention (part 3)

Then, the solder resist 20 is formed on the undersurface of the build-up layer 28 in which the wiring layer 28c is formed, and openings 21 are formed in the positions corresponding to the aforementioned solder balls 27. FIG. 14 shows the site where the solder resist 20 is formed.

Then, the supporting object 10 undergoes a shaping process. The shaping process is the same process, identical to the one performed in the first embodiment. Specifically, the thickness of the supporting object 10 is reduced to about 20 μm by etching or mechanical processing. However, the strength of the electronic part built-in substrate is not degraded even if the supporting object 10 is thinner because the curing process strengthens the mechanical strength of the build-up layers 18, 19, and 28.

Figure 15:
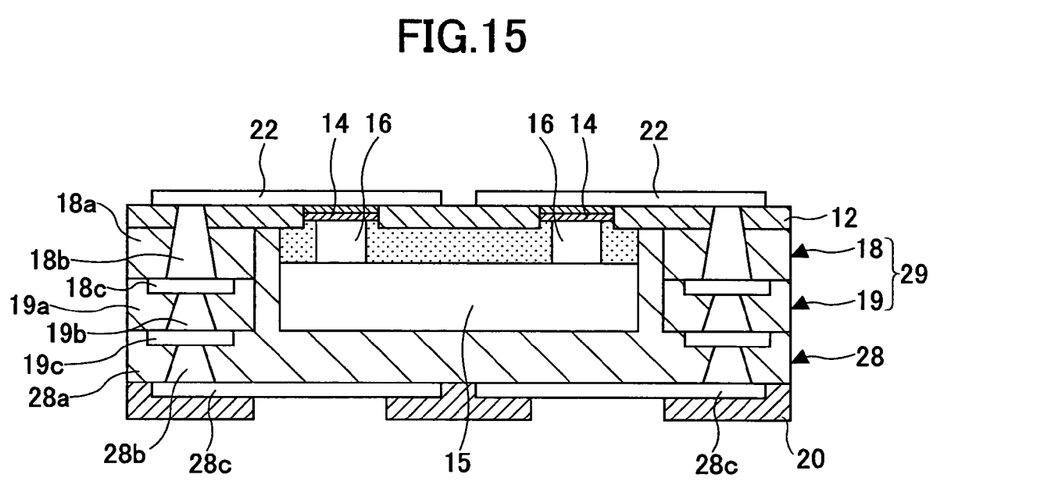
FIG. 15 is a cross-sectional view explaining the manufacturing method of the electronic part built-in substrate according to the second embodiment of the present invention (part 4)
Figure 16:
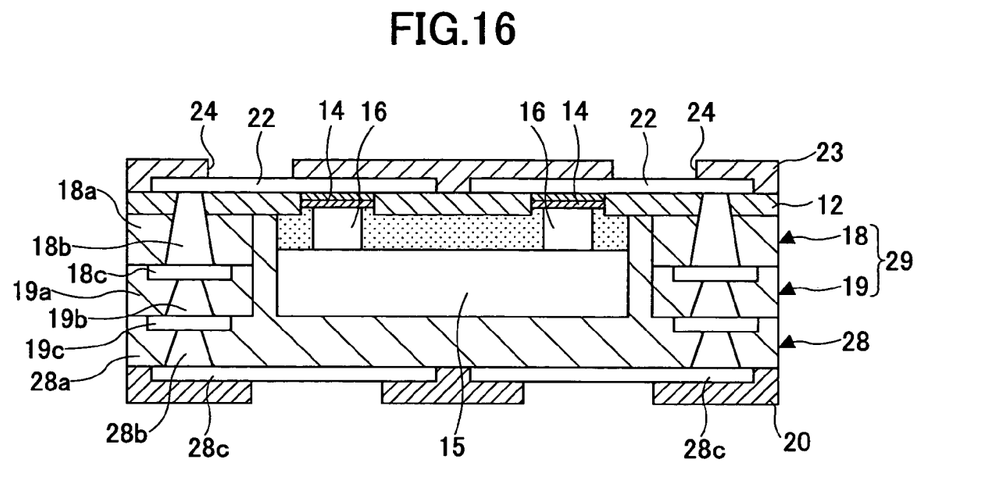
FIG. 16 is a cross-sectional view explaining the manufacturing method of the electronic part built-in substrate according to the second embodiment of the present invention (part 5)
Figure 17:
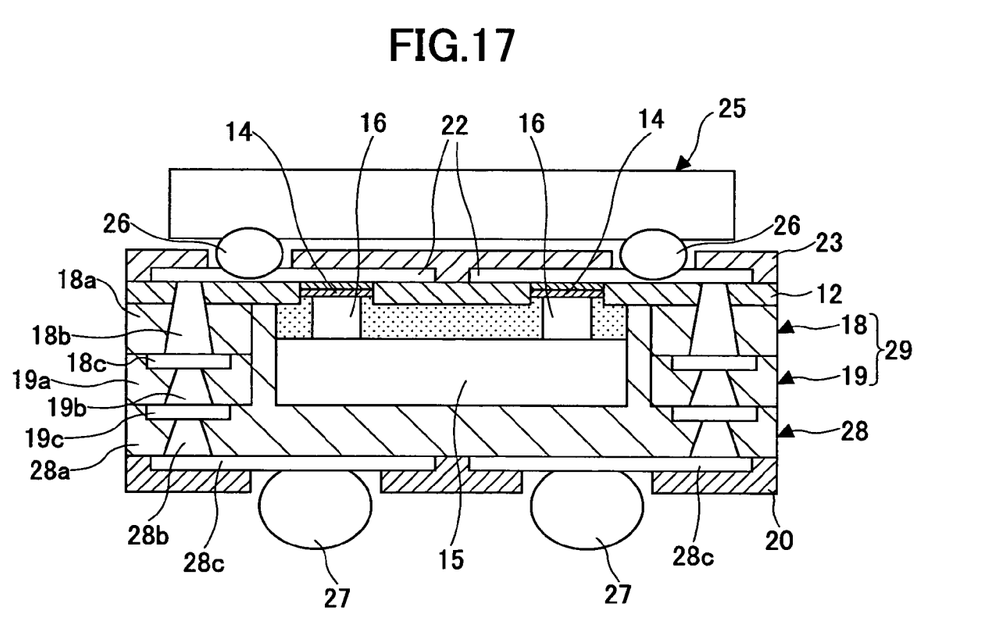
FIG. 17 is a cross-sectional view showing the semiconductor apparatus using the electronic part built-in substrate manufactured by the manufacturing method according to the second embodiment.

After the thin film process of the supporting object 10, the thinned supporting object 10 is subjected to a patterning process, and the upper wiring 22 is formed as shown in FIG. 15. Then, a solder resist 23 is arranged on the upper part of the upper wiring 22 formed as described above, and the openings 24 are formed at the positions where the solder vamps 26 of the semiconductor device 25 are to be bonded. Thus, the electronic part built-in substrate (shown in FIG. 10) is manufactured.

As mentioned above, as in the second embodiment, the supporting object 10 serves as a reinforcement and support when forming the build-up layers 18 and 19, and subsequently serves as the upper wiring 22. That is, the supporting object 10 provides two functions: it supports the build-up layers 18 and 19 and later serves as the upper wiring 22. Thus, the manufacturing process of the electronic part built-in substrate is greatly simplified, and the number of components is decreased.

Furthermore, as described above, according to the second embodiment, the built-in electronic part 15 is contained in the cavity 30 that is formed by the build-up laminating object 29 from the lamination of two or more build-up layers (two layers of the build-up layers 18 and 19).

Thus, even if each of the build-up layers 18 and 19 is thinner than the built-in electronic part 15, the thickness of the build-up laminating object 29 may match that of the built-in electronic part 15 because two or more layers have been laminated together. Therefore, it is unnecessary to make the built-in electronic part 15 thinner than a build-up layer (e.g., the build-up layers 18 and 19). As a result, the extra cost associated with modifying the built-in electronic part 15 may be avoided.

Although all the embodiments described heretofore involve laminating two or three build-up layers (i.e., build-up layers 18, 19, and 28) on the supporting object 10, the number of build-up layers that may be laminated can be greater than 3 (i.e., multilayer formation).

Figure 12:
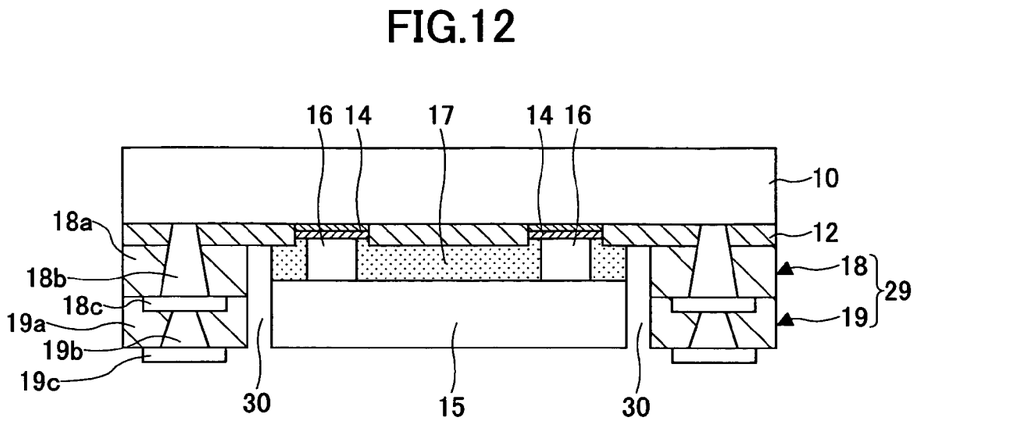
FIG. 12 is a cross-sectional view explaining the manufacturing method of the electronic part built-in substrate according to the second embodiment of the present invention (part 1)

Further, according to the embodiments, a gap is formed between the inner wall of the cavity 30, and the built-in electronic part 15 (as shown in FIG. 6 and FIG. 12), when accommodating the built-in electronic part 15. However, the gap is filled when the build-up layer 19 (in the first embodiment), and the build-up layer 28 (in the second embodiment) are thermally hardened, when the build-up layers flows into the gap. Therefore, no gap exists in the cavity 30.

Furthermore, although the embodiments described heretofore involve one electronic part built-in substrate made from one supporting object 10 (refer to FIG. 1) of one sheet, this was done in order to provide simple, easily understood descriptions and examples. The present invention can be applied to manufacturing two or more built-in electronic part substrates from one sheet of the supporting object 10 in order to raise productivity.

Further, the present invention is not limited to these embodiments, but variations and modifications may be made without departing from the scope of the present invention.

The present application is based on Japanese Priority Application No. 2004-239782 filed on Aug. 19, 2004 with the Japanese Patent Office, the entire contents of which are hereby incorporated by reference.

What is claimed is:

1. A manufacturing method of an electronic part built-in substrate that contains an electronic part in a build-up layer, comprising:

a process of arranging the electronic part on a supporting object that consists of a conductive material so that the electronic part is electrically connected to the supporting object;

a process of forming a build-up layer on the supporting object on which the electronic part is arranged so that the electronic part is contained; and a wiring formation process of forming a wiring layer connected to the electronic part by shaping the conductive supporting object, wherein the supporting object is shaped in the wiring formation process by using an etching method.

2. The manufacturing method of an electronic part built-in substrate as claimed in claim 1, wherein the first build-up layer forming process, and the 2nd build-up layer forming process use a semi additives method.

3. A manufacturing method of an electronic part built-in substrate that contains an electronic part in a build-up layer, comprising:

a first build-up layer forming process of forming one or more build-up layers on a supporting object that consists of a conductive material, the build-up layers being laminated to a thickness equivalent to a thickness of the electronic part, constituting a first build-up layer;

a cavity formation process of forming a cavity for accommodating the electronic part in the build-up layers that are laminated;

an accommodation process of accommodating the electronic part to the cavity, a second build-up layer forming process of forming a build-up layer further on the first build-up layer to which the cavity is formed, and on the electronic part; and a wiring formation process of forming a wiring layer connected to the electronic part by shaping the conductive supporting object.

4. The manufacturing method of an electronic part built-in substrate as claimed in claim 3, wherein the supporting object is shaped in the wiring formation process by using an etching method.

5. The manufacturing method of an electronic part built-in substrate as claimed in claim 3, wherein the first build-up layer forming process, and the 2nd build-up layer forming process use a semi additives method.

* * * * *